(12) United States Patent
Lee

(10) Patent No.: US 6,962,877 B2
(45) Date of Patent: Nov. 8, 2005

(54) METHODS OF PREVENTING OXIDATION OF BARRIER METAL OF SEMICONDUCTOR DEVICES

(75) Inventor: Ki Min Lee, Seoul (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 3 days.

(21) Appl. No.: 10/743,629

(22) Filed: Dec. 22, 2003

(65) Prior Publication Data

US 2004/0137717 A1    Jul. 15, 2004

(30) Foreign Application Priority Data

Dec. 30, 2002   (KR)   ............... 10-2002-0087369

(51) Int. Cl.[7] .............................................. H01I 21/44
(52) U.S. Cl. .................................... 438/681; 438/680
(58) Field of Search ............................... 438/681, 680, 438/683, 685, 688, 672, 675, 679

(56) References Cited

U.S. PATENT DOCUMENTS

| | | | |
|---|---|---|---|
| 6,133,142 A | 10/2000 | Tran et al. | ............ 438/625 |
| 6,444,542 B2 * | 9/2002 | Moise et al. | ............ 438/448 |
| 6,518,668 B2 | 2/2003 | Cohen | ............ 257/751 |
| 6,630,387 B2 * | 10/2003 | Horii | ............ 438/396 |
| 6,812,146 B2 * | 11/2004 | Akram | ............ 438/681 |
| 6,821,919 B2 * | 11/2004 | Hon et al. | ............ 501/96.1 |

* cited by examiner

*Primary Examiner*—David Nhu
(74) *Attorney, Agent, or Firm*—Hanley, Flight & Zimmerman, LLC.

(57) ABSTRACT

A method for preventing oxidation of a barrier metal layer of a semiconductor device is disclosed. The method includes the following steps. $Ti/Ti_{(1-x)}Al_xN$ is deposited on the bottom and sidewalls of a via hole in a substrate by a plasma chemical vapor deposition to form a first barrier metal layer. The via hole is filled with a plug material and a planarization process is performed to form a via plug. A second barrier metal layer and a metal line are deposited in sequence on the substrate including the via plug. Then, $Ti/Ti_{(1-x)}Al_xN$ as an ARC layer is deposited on the metal line by a plasma chemical vapor deposition. Accordingly, the present invention can improve device reliability by controlling continuous oxidation of the barrier metal layer using $Ti/Ti_{(1-x)}Al_xN$ formed by addition of aluminum to TiN.

8 Claims, 2 Drawing Sheets

METHODS OF PREVENTING OXIDATION OF BARRIER METAL OF SEMICONDUCTOR DEVICES

TECHNICAL FIELD

The present disclosure relates to semiconductor fabrication and, more particularly, to methods of oxidation of barrier metal of semiconductor devices.

BACKGROUND

In fabricating semiconductor devices, titanium nitride (TiN) is generally used as a barrier metal layer for via holes or as an inorganic antireflective coating (hereinafter referred to as "ARC") layer. For example, U.S. Pat. No. 6,133,142 to Tran et al. uses an ARC layer formed of TiN or Ti—TiN. As another example, U.S. Pat. No. 6,518,668 to Cohen uses a barrier metal layer comprising Ti or $TiN_x$. However, TiN may be oxidized in a following process. For example, the TiN may be oxidized during an ashing process that removes photoresist. The oxidized TiN may cause an increase in contact resistance, thereby degrading operational characteristics of the device.

DETAILED DESCRIPTION

Example methods of preventing oxidation of a barrier metal layer and an ARC layer that substantially obviate one or more problems due to limitations and disadvantages of the related art are disclosed herein. One example method prevents a barrier metal layer and an ARC layer from being oxidized by forming $Ti_{(1-x)}Al_xN$ as a barrier metal layer and an ARC layer. The $Ti_{(1-x)}Al_xN$ is formed by adding aluminum to TiN. The barrier metal layer and the ARC layer formed of $Ti_{(1-x)}Al_xN$ have good oxidation resistance, thereby improving device reliability.

As disclosed herein, one particular example method includes forming a via hole on a substrate, depositing $Ti/Ti_{(1-x)}Al_xN$ as a first barrier metal layer on the bottom and sidewalls of the via hole by means of a plasma chemical vapor deposition, and filling the via hole with a plug material to form a via plug. The example method may further include performing a planarization process to flatten the via plug, depositing a second barrier metal layer and a metal line in sequence on the substrate including the via plug, and depositing an ARC layer of $Ti/Ti_{(1-x)}Al_xN$ on the metal line by means of a plasma chemical vapor deposition. In such an example, the second barrier metal layer may be formed of TiN or $Ti/Ti_{(1-x)}Al_xN$.

In depositing $Ti/Ti_{(1-x)}Al_xN$, the plasma chemical vapor deposition may be performed using $TiCl_4$, $AlCl_3$, Ar, $N_2$, and $H_2$ gases at a temperature between about 400° C. and 500° C. and a radio frequency (RF) power between 40 W and 60 W under a pressure between 1 Torr and 2 Torr. Here, a ratio of $H_2/N_2/Ar$ is preferably between 20/5/50 standard cubic centimeter per minute (sccm) and 40/10/50 sccm. The "x" in $Ti_{(1-x)}Al_xN$ has a value between 0.5 and less than 1.

Figure 1A:
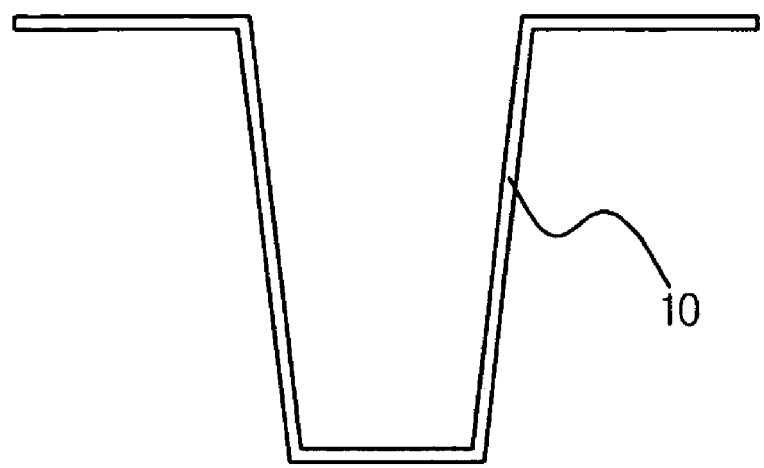
FIGS. 1a through 1d illustrate, in cross-sectional views, the results of process steps for forming a barrier metal layer and an ARC layer of a semiconductor device.

Referring to FIG. 1a, a via hole is formed in a substrate. After the via hole is formed, $Ti/Ti_{(1-x)}Al_xN$ as a first barrier metal layer 10 is deposited on the bottom and sidewalls of the via hole using, for example, a plasma chemical vapor deposition process.

Figure 1B:
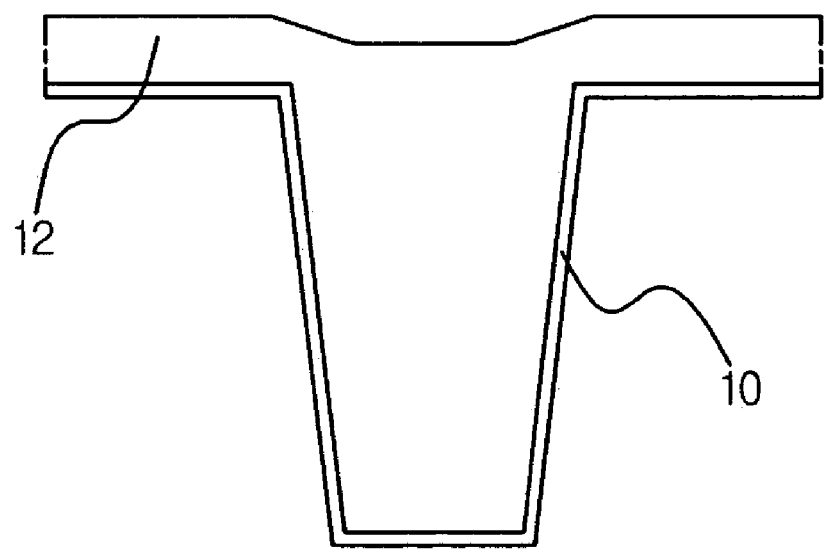

Referring to FIG. 1b, after the first metal layer 10 is deposited, the via hole is filled with a plug material 12, which may be, for example, tungsten or aluminum, to form a via plug.

Figure 1C:
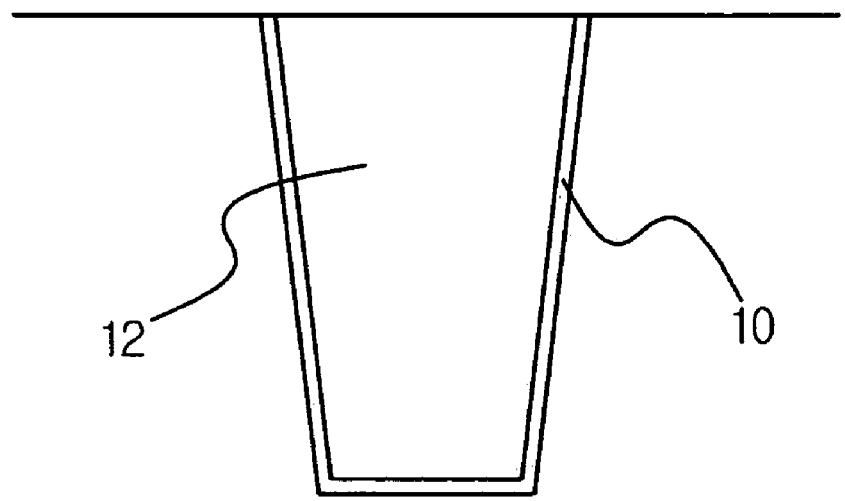

Referring to FIG. 1c, a planarization process such as chemical mechanical polishing (CMP) is performed to flatten the plug material 12.

Figure 1D:
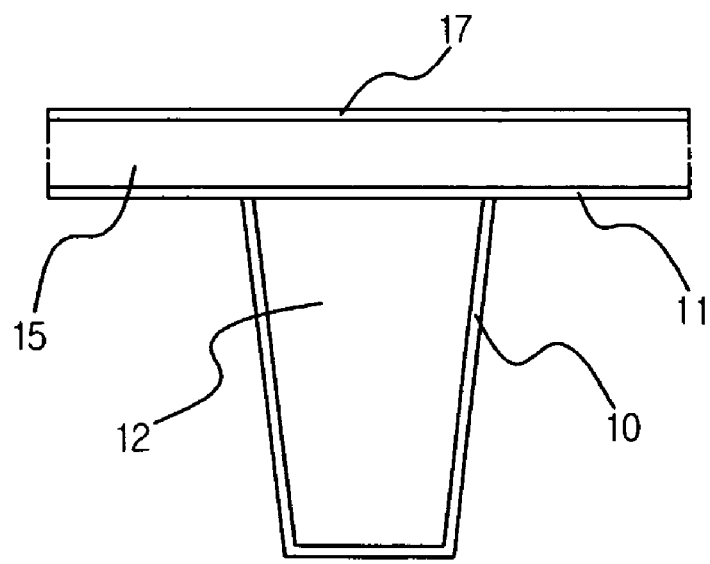

Referring to FIG. 1d, a second barrier metal layer 11 and a metal line 15 are deposited in sequence on the substrate including the via plug. Afterwards, an inorganic ARC layer 17 is deposited on the metal line 15. In one example, the second barrier metal layer 11 is formed of $Ti/Ti_{(1-x)}Al_xN$ or TiN and the inorganic ARC layer 17 is formed of $Ti/Ti_{(1-x)}Al_xN/TiN$ and is deposited by means of a physical vapor deposition (PVD) or a chemical vapor deposition (CVD).

The $Ti_{(1-x)}Al_xN$ may be formed, for example, by adding aluminum to TiN, which has been conventionally used as a barrier metal or ARC. The first barrier metal layer and the ARC layer formed of $Ti/Ti_{(1-x)}Al_xN$ provide good resistance to oxidation.

The process disclosed herein can improve device reliability by controlling continuous oxidation of the barrier metal layer using $Ti_{(1-x)}Al_xN$ formed by addition of aluminum to TiN. In addition, by using $N_2$ instead of $NH_3$ in the plasma chemical vapor deposition process, the disclosed process can provide a uniform nitride composition.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of preventing oxidation of a barrier metal of a semiconductor device, the method comprising:
    forming a via hole in a substrate;
    depositing $Ti/Ti_{(1-x)}Al_xN$ as a first barrier metal layer on a bottom and sidewalls of the via hole by a plasma chemical vapor deposition;
    filling the via hole with a plug material to form a via plug;
    performing a planarization process to flatten the via plug;
    depositing a second barrier metal layer and a metal line in sequence on the substrate including the via plug; and
    depositing an ARC layer of $Ti/Ti_{(1-x)}Al_xN$ on the metal line by a plasma chemical vapor deposition.

2. A method as defined by claim 1, wherein the second barrier metal layer comprises TiN or $Ti/Ti_{(1-x)}Al_xN$.

3. A method as defined by claim 2, wherein "x" in $Ti/Ti_{(1-x)}Al_xN$ has a value between 0.5 and less than 1.

4. A method as defined by claim 1, wherein the plug material comprises tungsten or aluminum.

5. A method as defined by claim 1, wherein the plasma chemical vapor deposition is performed using $TiCl_4$, $AlCl_3$, Ar, $N_2$, and $H_2$ gases.

6. The method as defined by claim 5, wherein the ratio of $H_2/N_2/Ar$ is between 20/5/50 sccm and 40/10/50 sccm.

7. A method as defined by claim 1, wherein the plasma chemical vapor deposition is performed using a radio frequency (RE) power between 40 W and 60 W at a temperature between 400° C. and 500° C. under a pressure between 1 Torr and 2 Torr.

8. A method as defined by claim 1, wherein "x" in $Ti/Ti_{(1-x)}Al_xN$ has a value between 0.5 and less than 1.

* * * * *